US012615819B2

(12) United States Patent
Kang et al.

(10) Patent No.: US 12,615,819 B2
(45) Date of Patent: Apr. 28, 2026

(54) SPACE CONFINED EPI FOR STACKED FET

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 18/457,826

(22) Filed: Aug. 29, 2023

(65) Prior Publication Data

US 2025/0081550 A1    Mar. 6, 2025

(51) Int. Cl.

| | |
|---|---|
| *H01L 29/06* | (2006.01) |
| *H01L 23/48* | (2006.01) |
| *H01L 27/092* | (2006.01) |
| *H01L 29/08* | (2006.01) |
| *H01L 29/417* | (2006.01) |
| *H01L 29/423* | (2006.01) |
| *H01L 29/775* | (2006.01) |
| *H01L 29/786* | (2006.01) |
| *H10D 30/43* | (2025.01) |
| *H10D 30/67* | (2025.01) |
| *H10D 62/10* | (2025.01) |
| *H10D 62/13* | (2025.01) |
| *H10D 84/85* | (2025.01) |
| *H10W 20/20* | (2026.01) |

(52) U.S. Cl.
CPC ........... *H10D 62/121* (2025.01); *H10D 30/43* (2025.01); *H10D 30/6729* (2025.01); *H10D 30/6735* (2025.01); *H10D 30/6757* (2025.01); *H10D 62/151* (2025.01); *H10D 84/85* (2025.01); *H10W 20/20* (2026.01)

(58) Field of Classification Search
CPC .. H10D 62/121; H10D 30/43; H10D 30/6729; H10D 30/6735; H10D 30/6757; H10D 62/151; H10D 84/85; H10D 84/0149; H10D 84/8312; H10D 84/017; H10D 84/0186; H10D 84/851; H10D 84/013; H10D 84/832; H10D 88/00; H10D 88/01; H10D 84/038; H10D 30/014; H01L 23/481
USPC ........................................... 257/288
See application file for complete search history.

(56) References Cited

U.S. PATENT DOCUMENTS

| | | | |
|---|---|---|---|
| 8,450,149 B2 | 5/2013 | Bayan | |
| 10,573,561 B2 | 2/2020 | Cheng | |
| 11,043,493 B2 | 6/2021 | Bi | |
| 11,043,598 B2 | 6/2021 | Lee | |

(Continued)

*Primary Examiner* — Tong-Ho Kim
(74) *Attorney, Agent, or Firm* — Samuel A. Waldbaum

(57) ABSTRACT

A microelectronic structure that includes a stacked nanosheet FET transistor that includes an upper nanosheet transistor and a lower nanosheet transistor. The upper nanosheet transistor includes an upper source/drain and the upper source/drain includes an upper tip that is pointed in a first direction. The lower nanosheet transistor includes a lower source/drain and the lower source/drain includes a lower tip pointed in a second direction. The first direction is different than the second direction.

20 Claims, 23 Drawing Sheets

(56)  References Cited

U.S. PATENT DOCUMENTS

| 2022/0181258 | A1* | 6/2022 | Liebmann | H10D 30/67 |
| 2022/0406908 | A1 | 12/2022 | Reznicek | |
| 2023/0046546 | A1* | 2/2023 | Park | H10D 84/0186 |
| 2023/0065715 | A1 | 3/2023 | Xie | |
| 2023/0075966 | A1 | 3/2023 | Ruilong | |
| 2024/0162229 | A1* | 5/2024 | Xie | H01L 21/76831 |

* cited by examiner

TOP DOWN VIEW

CROSS-SECTION X

CROSS-SECTION Y

CROSS-SECTION X

CROSS-SECTION Y

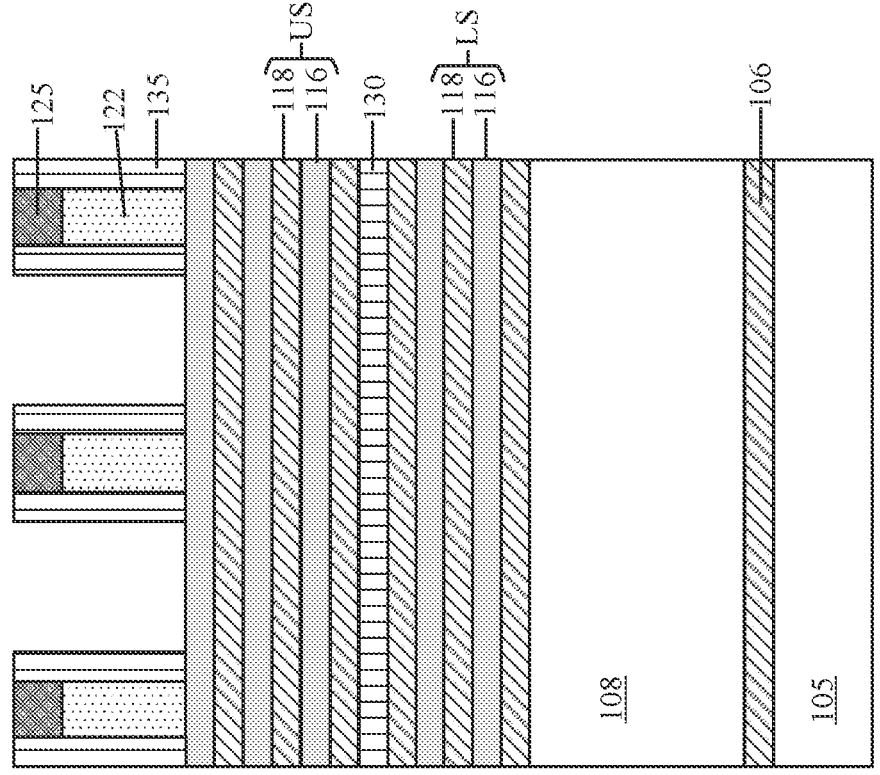
125
122
135
118 } US
116
130
118 } LS
116
106
108
105
FIG. 6
CROSS-SECTION X
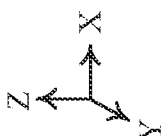

CROSS-SECTION Y

CROSS-SECTION Y

CROSS-SECTION X

CROSS-SECTION Y

CROSS-SECTION X

CROSS-SECTION Y 160
135
145
160 ⎤ US
116 ⎦
130
162 ⎤ LS
116 ⎦
106

172
170
155
165
165
150
108
105

CROSS-SECTION X

CROSS-SECTION Y

CROSS-SECTION X

CROSS-SECTION Y

CROSS-SECTION X

CROSS-SECTION Y

CROSS-SECTION X

CROSS-SECTION X

CROSS-SECTION Y

CROSS-SECTION X

CROSS-SECTION Y

SPACE CONFINED EPI FOR STACKED FET

BACKGROUND

The present invention generally relates to the field of microelectronics, and more particularly to formation of the source/drain epi in a stacked FET device.

Nanosheet is the lead device architecture in continuing CMOS scaling. However, nanosheet technology has shown issues when scaling down such that as the devices become smaller and closer together, they are interfering with each other.

BRIEF SUMMARY

Additional aspects and/or advantages will be set forth in part in the description which follows and, in part, will be apparent from the description, or may be learned by practice of the invention.

A microelectronic structure that includes a stacked nanosheet FET transistor that includes an upper nanosheet transistor and a lower nanosheet transistor. The upper nanosheet transistor includes an upper source/drain and the upper source/drain includes an upper tip that is pointed in a first direction. The lower nanosheet transistor includes a lower source/drain and the lower source/drain includes a lower tip pointed in a second direction. The first direction is different than the second direction.

A microelectronic structure that includes a stacked nanosheet FET transistor that includes an upper nanosheet transistor and a lower nanosheet transistor. The upper nanosheet transistor includes an upper source/drain and the upper source/drain includes an upper tip that is pointed in a first direction. The upper source/drain has a first width as measured in parallel with a gate direction. The lower nanosheet transistor includes a lower source/drain and the lower source/drain includes a lower tip pointed in a second direction. The lower source/drain has a second width as measure in parallel with the gate direction. The first direction is different than the second direction and the second width is larger than the first width.

A microelectronic structure that includes a first stacked nanosheet FET transistor that includes a first upper nanosheet transistor and a first lower nanosheet transistor. The first upper nanosheet transistor includes a first upper source/drain and the first upper source/drain includes a first upper tip that is pointed in a first direction. The first upper source/drain has a first width as measured in parallel with a gate direction. The first lower nanosheet transistor includes a first lower source/drain and the first lower source/drain includes a first lower tip pointed in a second direction. The first lower source/drain has a second width as measure in parallel with the gate direction. The second width is larger than the first width.

A second stacked nanosheet FET transistor that includes a second upper nanosheet transistor and a second lower nanosheet transistor. The second upper nanosheet transistor includes a second upper source/drain and the second upper source/drain includes a first upper tip that is pointed in a first direction. The second upper source/drain has a third width as measured in parallel with the gate direction. The second lower nanosheet transistor includes a second lower source/drain and the second lower source/drain includes a second lower tip pointed in the second direction. The second lower source/drain has a fourth width as measure in parallel with the gate direction. The first direction is different than the second direction and the fourth width is larger than the third width.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 6 illustrates a cross section X of the stack of alternating layers of the stacked FET device after the formation of spacers, in accordance with the embodiment of the present invention.

DETAILED DESCRIPTION

Figure 1:
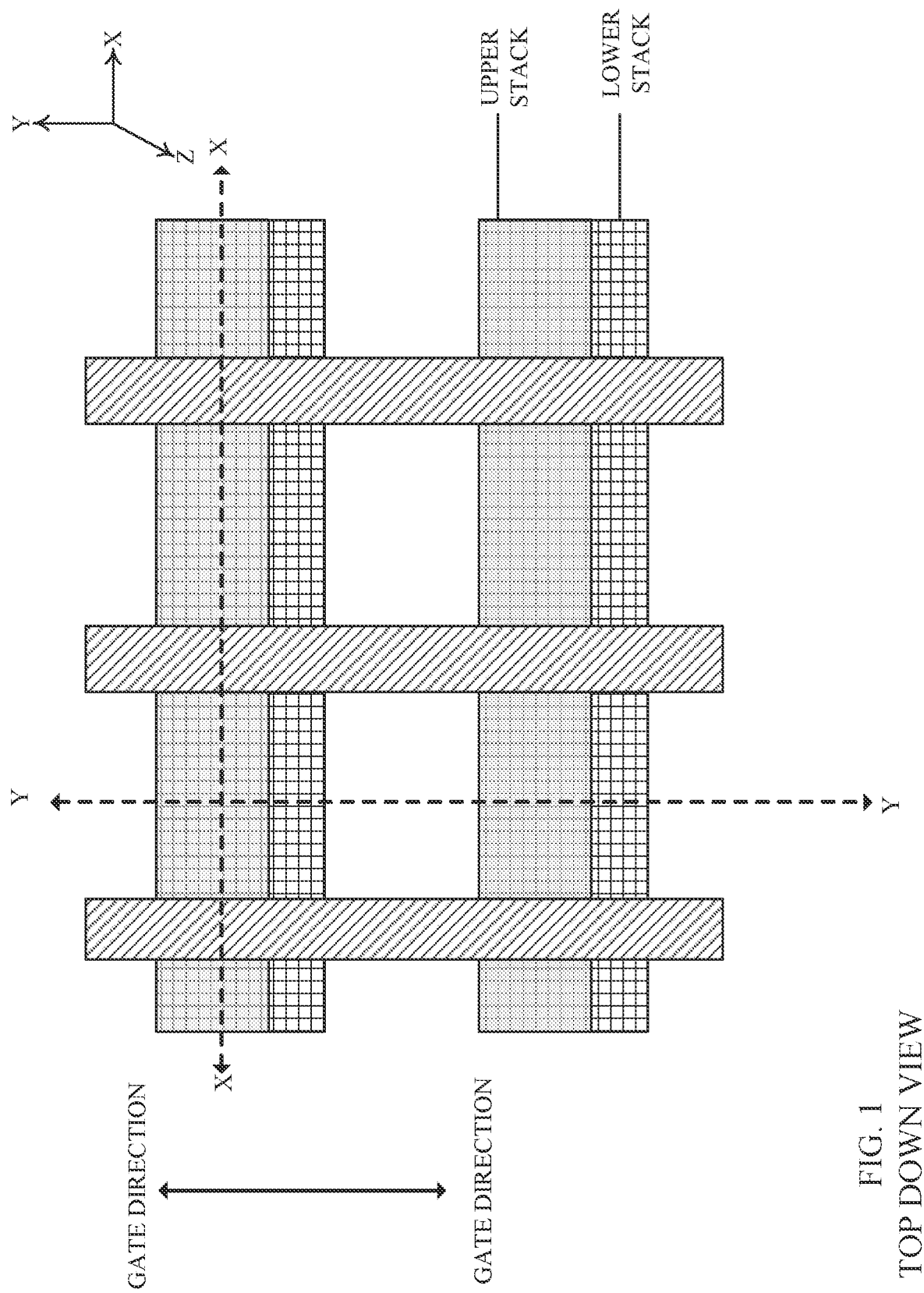
FIG. 1 illustrates a top-down view of multiple stacked nano devices (stacked nanosheet transistors), in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. Stack FETs are comprised of a lower nanosheet transistor (or device) and an upper nanosheet transistor (or device) where contacts need to be formed to the source/drain of each of the devices. The width of the lower device tends to be larger than the width of the upper device to create separation between the devices. This separation generates space for the formation of the contacts for the devices.

Typically, the lower source/drains of the stacked FET are formed first then an isolation layer is formed on top of the lower source/drains. Then the upper source/drains are formed.

In contrast, the present invention is forming the upper source/drain prior to the formation of the lower source/drain. The upper source/drain is formed during the frontside processing of the stacked FET, and the lower source/drain is formed during the backside processing of the stacked FET.

FIG. 1 illustrates a top-down view of multiple stacked nano devices, or stacked nanosheet transistors, which can be comprised of electronic components such as transistors, in accordance with the embodiment of the present invention. The cross-section X extends horizontally through the stack/row of a plurality of nanostack FET devices (or stacked nanosheet transistors), where the cross-section is perpendicular to the gate direction. Cross section Y is perpendicular to cross section X and in parallel with the gate direction, where cross section Y is through a source/drain region that spans across multiple stacked nano stacks.

Figure 2:
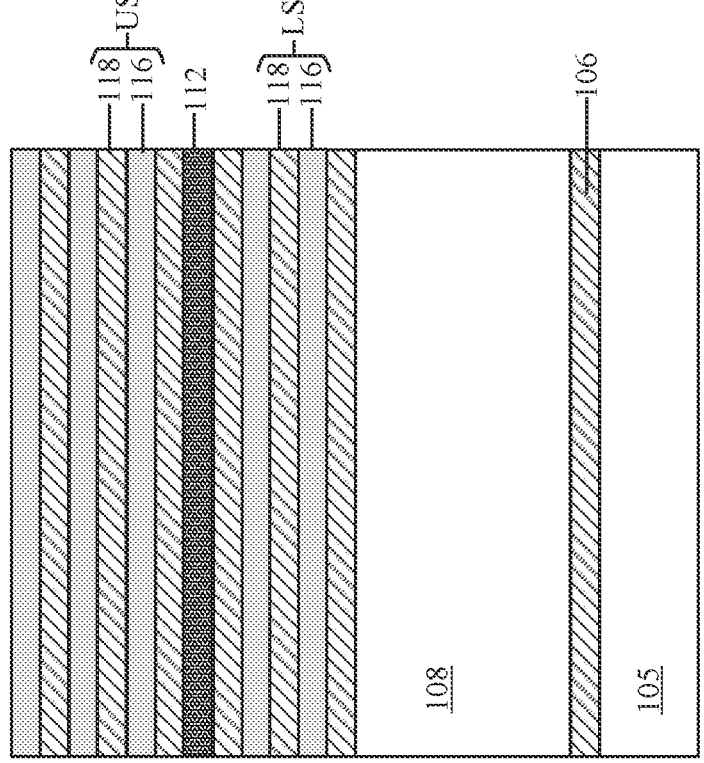
FIG. 2 illustrates a cross section X of the stack of alternating layers of the stacked FET device, in accordance with the embodiment of the present invention.
Figure 2:
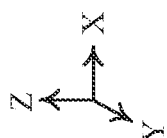
Figure 3:
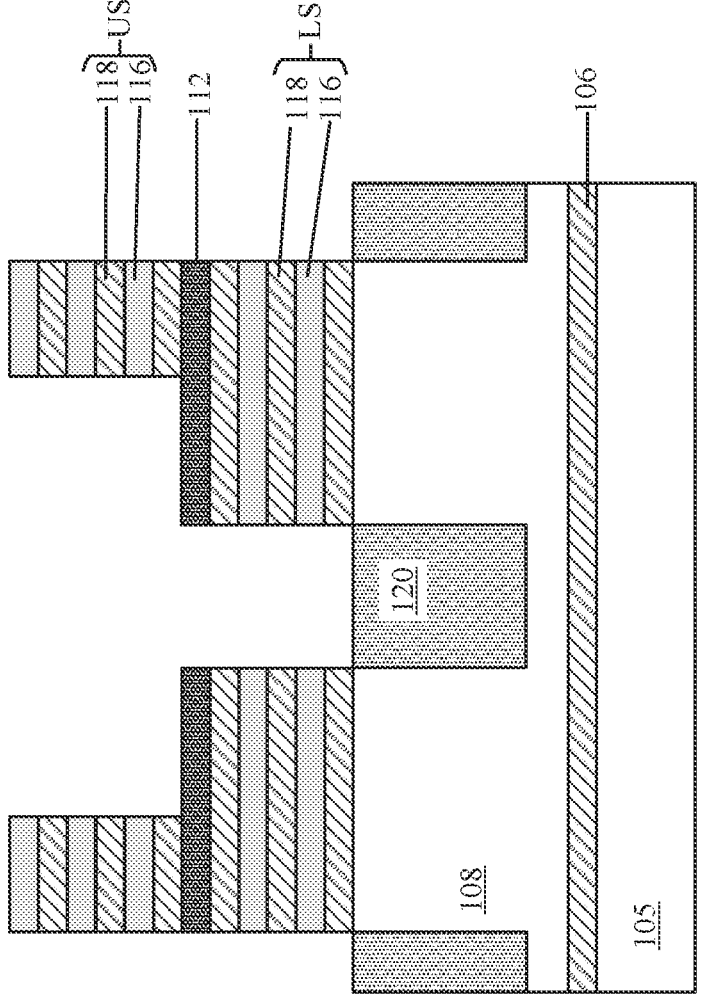
FIG. 3 illustrates a cross section Y of the source/drain region of the stacked FET device, in accordance with the embodiment of the present invention.
Figure 3:
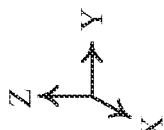

Referring now to FIGS. 2, and 3, a structure is shown during an intermediate step of a method of fabricating stacked nano devices, such as, a stacked nanosheet transistor structure after formation of the alternating layers that will form the stacked nano device, according to an embodiment of the invention.

FIGS. 2, and 3 illustrate the processing stage of the structure after separating the alternating layers to form adjacent nanostack (nanosheet) columns. FIG. 2 illustrates a first substrate 105, an etch stop 106, a second substrate 108, a lower stack LS, an upper stack UP, a separating sacrificial layer 112.

The first substrate 105 and the second substrate 108 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the first substrate 105 and the second substrate 108. In some embodiments, first substrate 105 and the second substrate 108 includes both semiconductor materials and dielectric materials. The semiconductor first substrate 105 and the second substrate 108 may also comprise an organic semiconductor or a layered semiconductor such as, for example, Si, SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein.

The separating sacrificial layer 112 is located between the lower stack LS and the upper stack US. The separating sacrificial layer 112 can be comprised of, for example, SiGe, where Ge is in the range of about 45% to 70%. The high percentage of Ge in the separating sacrificial layer 112 allows for selective targeting of the separating sacrificial layer 112 over the plurality of sacrificial layers 118 that are included in the alternating layers of the lower stack LS and the upper stack US. The lower stack LS is comprised of alternating layers of channel layers 116 and sacrificial layers 118. The upper stack US is comprised of alternating layers of channel layers 116 and sacrificial layers 118. The sacrificial layers 118 located in the lower stack LS and the upper stack US can be comprised of, for example, SiGe, where Ge is in the range of about 15% to 35%. Channel layers 116 located in the lower stack LS and the upper stack US are nanosheets comprised of, for example, Si.

FIG. 3 illustrates the alternating layers being separated into adjacent nanostack (nanosheet) columns. A trench (not shown) was formed in the second substrate 108 when the alternating layers and the separating sacrificial layer 112 were separated into multiple columns. The trenches were filled in with a shallow trench isolation layer 120. FIG. 3 illustrates that the upper stack US and the lower stack LS have different widths as measured in the Y-axis. The width of the upper stack US is narrower when compared to the width of the lower stack LS. The difference in the widths of the lower stack LS and the upper stack US provides separation/space between the stacked devices (transistors) in the Z-axis and the Y-axis.

Figure 4:
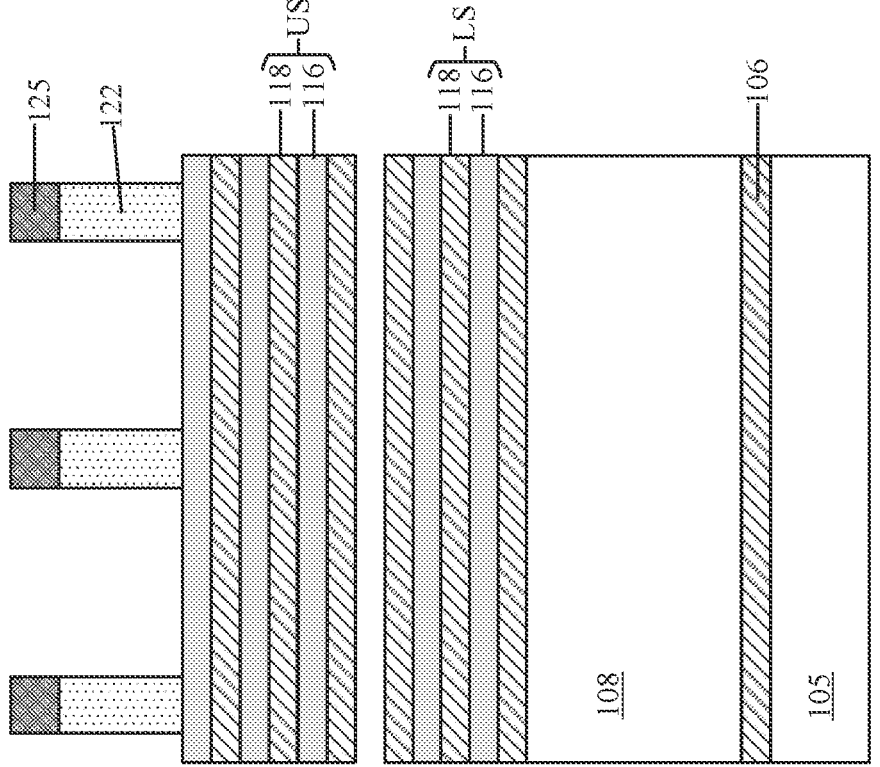
FIG. 4 illustrates a cross section X of the stack of alternating layers of the stacked FET device after the formation of dummy gates, and the removal of the separating sacrificial layer, in accordance with the embodiment of the present invention.
Figure 4:
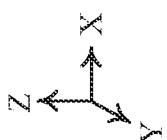
Figure 5:
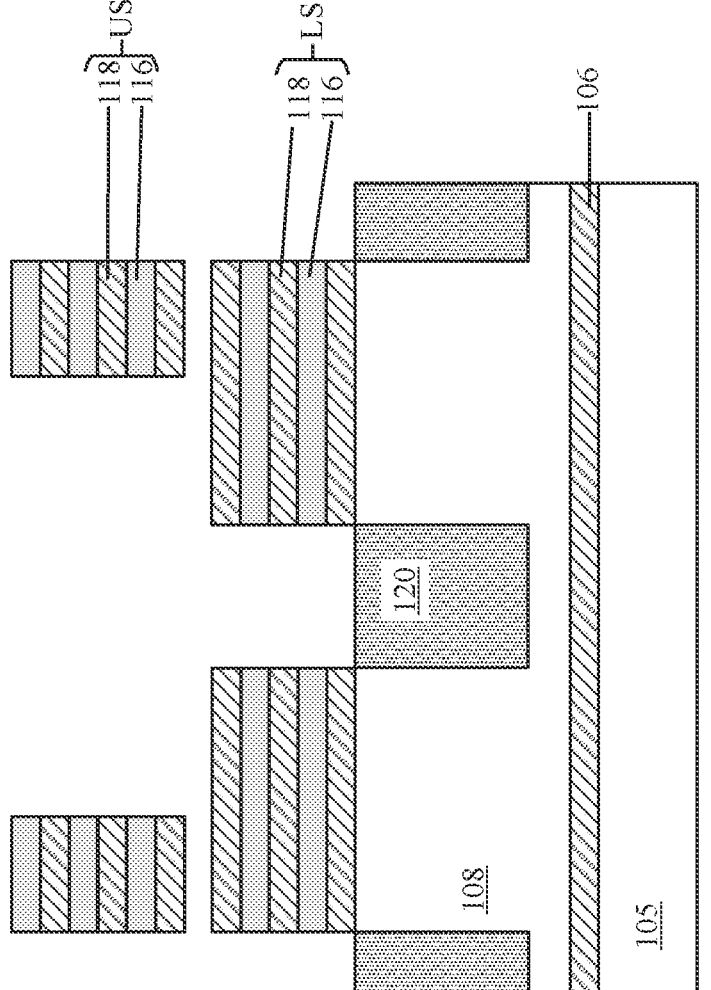
FIG. 5 illustrates a cross section Y of the source/drain region of the stacked FET device after the formation of dummy gates, and the removal of the separating sacrificial layer, in accordance with the embodiment of the present invention.
Figure 5:
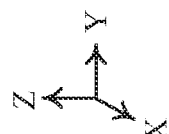

FIGS. 4 and 5 illustrate the processing stage of the structure after the formation of dummy gates 122, and the removal of the separating sacrificial layer 112. A dummy gate 122 is formed on top of the upper stack US and a hardmask 125 is formed on top of the dummy gate 122. The hardmask 125 and the dummy gate 122 are patterned to form a plurality of gate regions. The separating sacrificial layer 112 is selectively removed. The separating sacrificial layer 112 can be targeted for removal because of the higher concentration of Ge when compared to the sacrificial layers 118.

Figure 7:
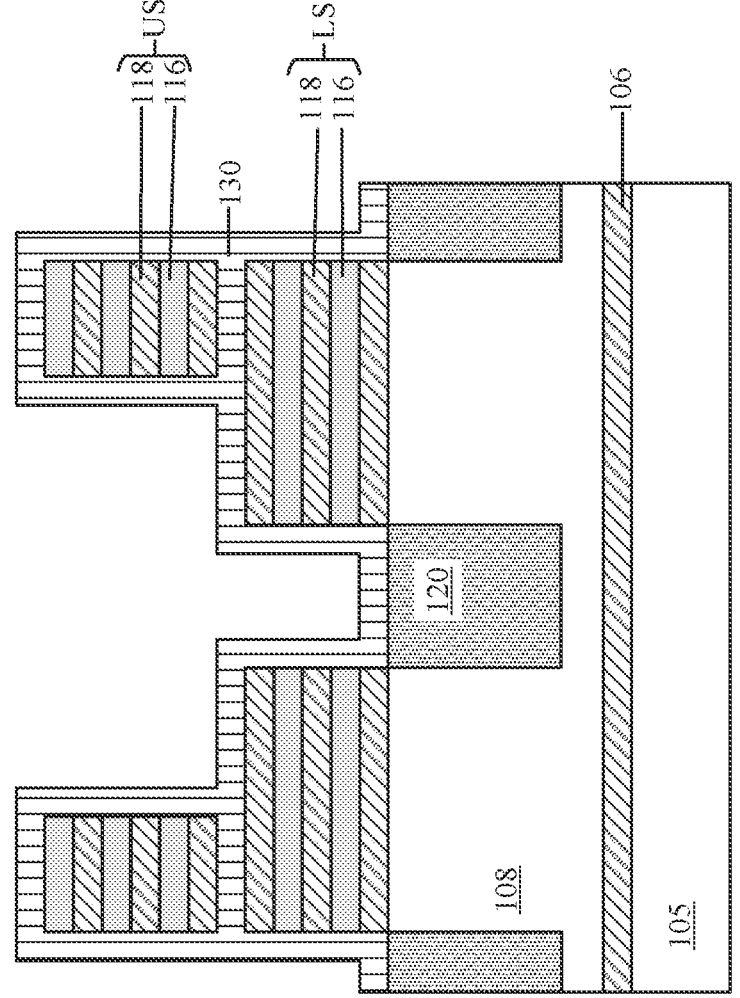
FIG. 7 illustrates a cross section Y of the source/drain region of the stacked FET device after the formation of spacers, in accordance with the embodiment of the present invention.
Figure 7:
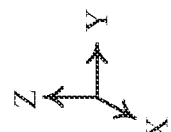

FIGS. 6 and 7 illustrate the processing stage of the structure after the formation of spacers 130, and 135. A plurality of spacers 130, 135 are formed on the exposed surfaces, and the spacer 135 is patterned to form gate spacer 135. Gate spacer 135 are vertical segments of the spacer material (for example, a dielectric material) located adjacent to the gate regions comprised of the dummy gate 122 and the hardmask 125. Spacer 130 separates the upper stack US and the lower stack LS as illustrated in FIG. 6. Spacer 130 encapsulates the upper stack US in the source drain region and the spacer 130 is located on three sides of the lower stack LS in the source/drain region, as illustrated in FIG. 7.

Figure 8:
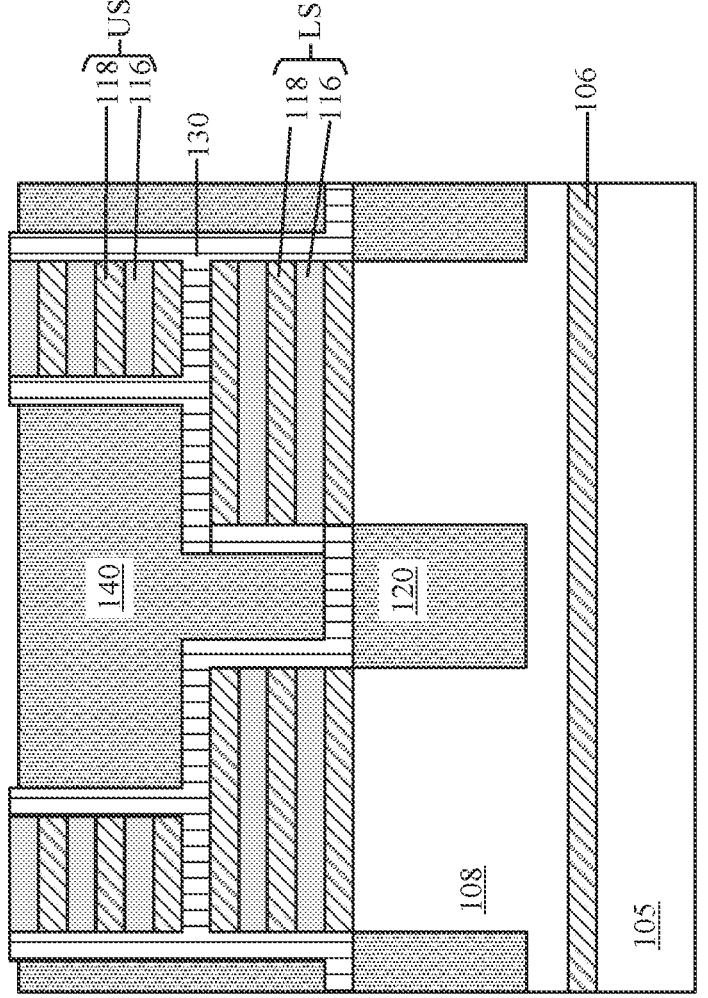
FIG. 8 illustrates a cross section Y of the source/drain region of the stacked FET device after the formation of a first lithography layer and the exposing of the upper stacks in the source/drain region, in accordance with the embodiment of the present invention.
Figure 8:
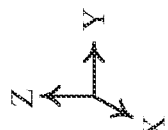

FIG. 8 illustrates the processing stage of the structure after the formation of a first lithography layer 140 and the exposing of a top layer of the upper stacks US in the source/drain region. A first lithography layer 140 is formed in the source/drain region. The first lithography layer 140 is patterned to expose the spacer 130 located on top of the upper stack US. Horizontal sections of spacer 130 that were located on top of the upper stack US are removed to expose the top layer of the upper stack US.

Figure 9:
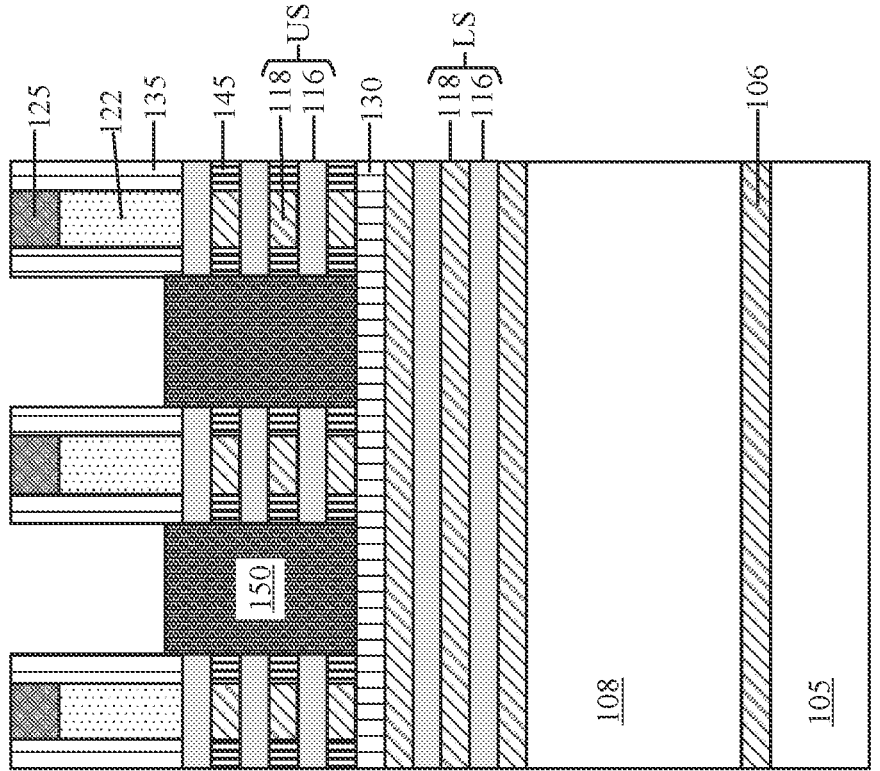
FIG. 9 illustrates a cross section X of the stack of alternating layers of the stacked FET device after the formation of inner spacers and the formation of upper source/drains, in accordance with the embodiment of the present invention.
Figure 9:
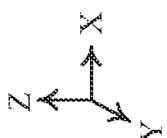
Figure 10:
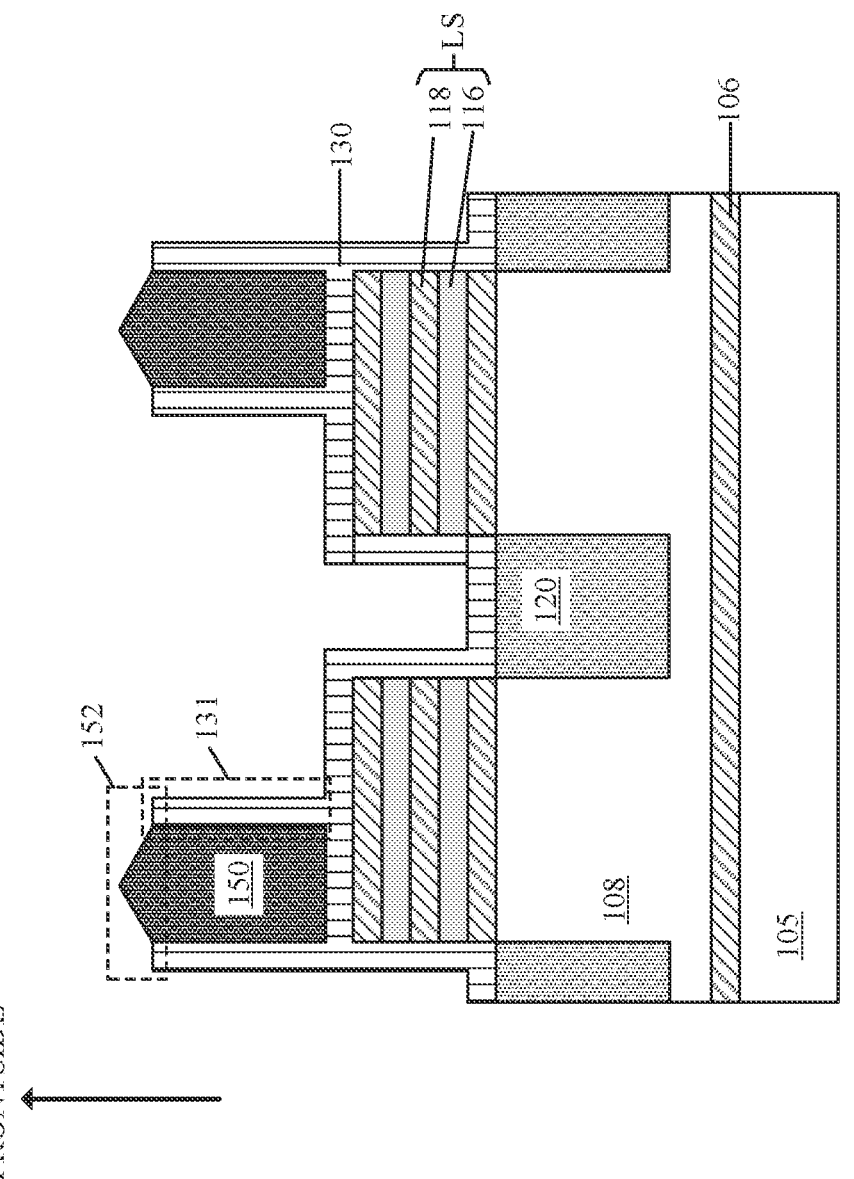
FIG. 10 illustrates a cross section Y of the source/drain region of the stacked FET device after the formation of inner spacers and the formation of upper source/drains, in accordance with the embodiment of the present invention.

FIGS. 9 and 10 illustrate the processing stage of the structure after the formation of inner spacers 145 and the formation of upper source/drains 150. The first lithography layer 140 is removed. The alternating layers of the upper stack US are removed in the source/drain regions thus separating the upper stack US into a plurality of columns located in the gate regions. The sacrificial layers 118 of the upper stack US are recessed to create an empty space. This empty space is filled with a dielectric material to form the inner spacer 145. Upper source/drains 150 are epitaxially grown in the source/drain region located between the columns. The vertical sections of spacer 130, as emphasized by dashed box 131, act as retaining walls during the formation of the upper source/drain 150. The upper source/drains 150 have a protrusion/point/tip that points towards the frontside of the device. Dashed box 152 emphasizes the protrusion/point/tip of the upper source/drain 150 which shows the protrusion/point/tip pointing towards the frontside of the device. At this point in the processing process the lower source/drains have not been formed yet.

The upper source/drains 150 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 11:
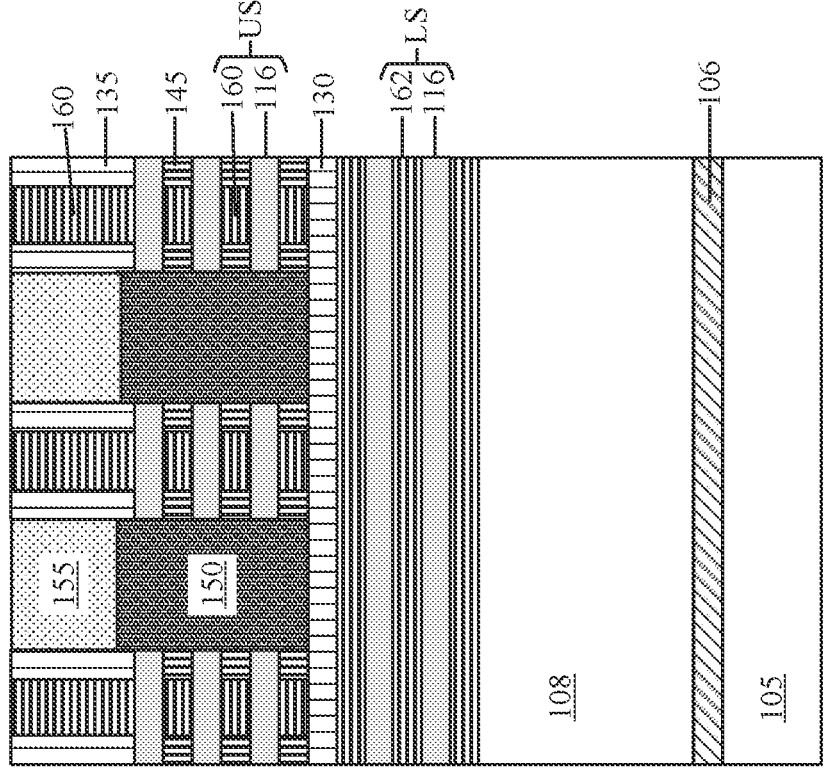
FIG. 11 illustrates a cross section X of the stack of alternating layers of the stacked FET device after the formation of upper gate, the lower gate, and the frontside interlayer dielectric layer, in accordance with the embodiment of the present invention.
Figure 12:
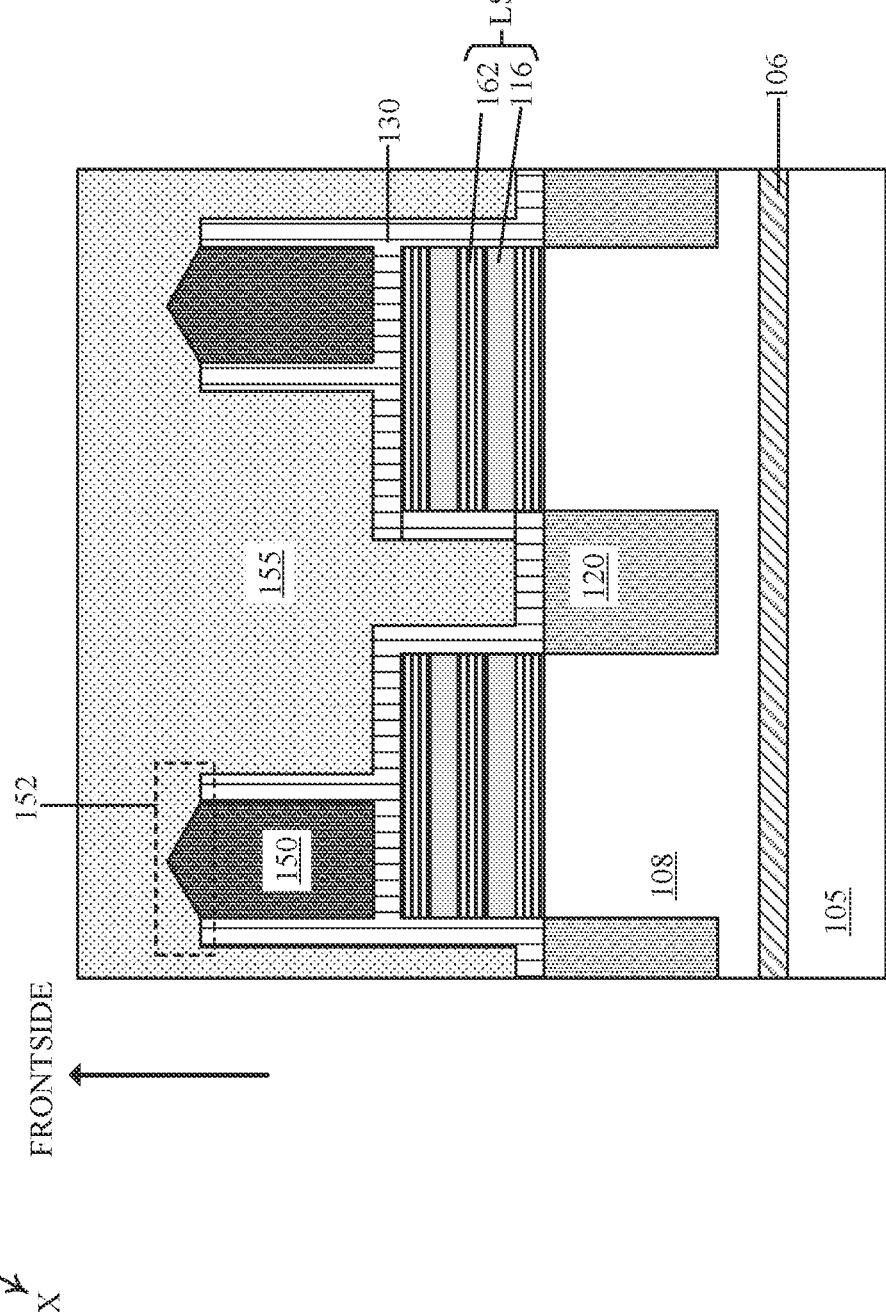
FIG. 12 illustrates a cross section Y of the source/drain region of the stacked FET device after the formation of upper gate, the lower gate, and the frontside interlayer dielectric layer, in accordance with the embodiment of the present invention.

FIGS. 11 and 12 illustrate the processing stage of the structure after the formation of upper gate 160, the lower gate 162, and the frontside interlayer dielectric layer 155. A frontside interlayer dielectric layer 155 is formed in the source/drain regions, such that, the frontside interlayer dielectric layer 155 is formed on top of the upper source/drains 150 and on top of the spacer 130. Hardmask 125 and dummy gate 122 are removed. The sacrificial layers 118 in the upper stack US and the sacrificial layers 118 in the lower stack LS are removed. The removal of these layers creates an empty space for the formation of the upper gate 160 and the lower gate 162. Upper gate 160 and the lower gate 162 are formed in the space created by the removal of these layers. The upper gate 160 is located around channel layers 116 in the upper stack US and between vertical segments of the gate spacer 135. The lower gate 162 is located where the sacrificial layers 118 of the lower stack LS were located. The lower stack LS now includes alternating layers of channel layers 116 and the lower gate 162. Upper gate 160 and the lower gate 162 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

Figure 13:
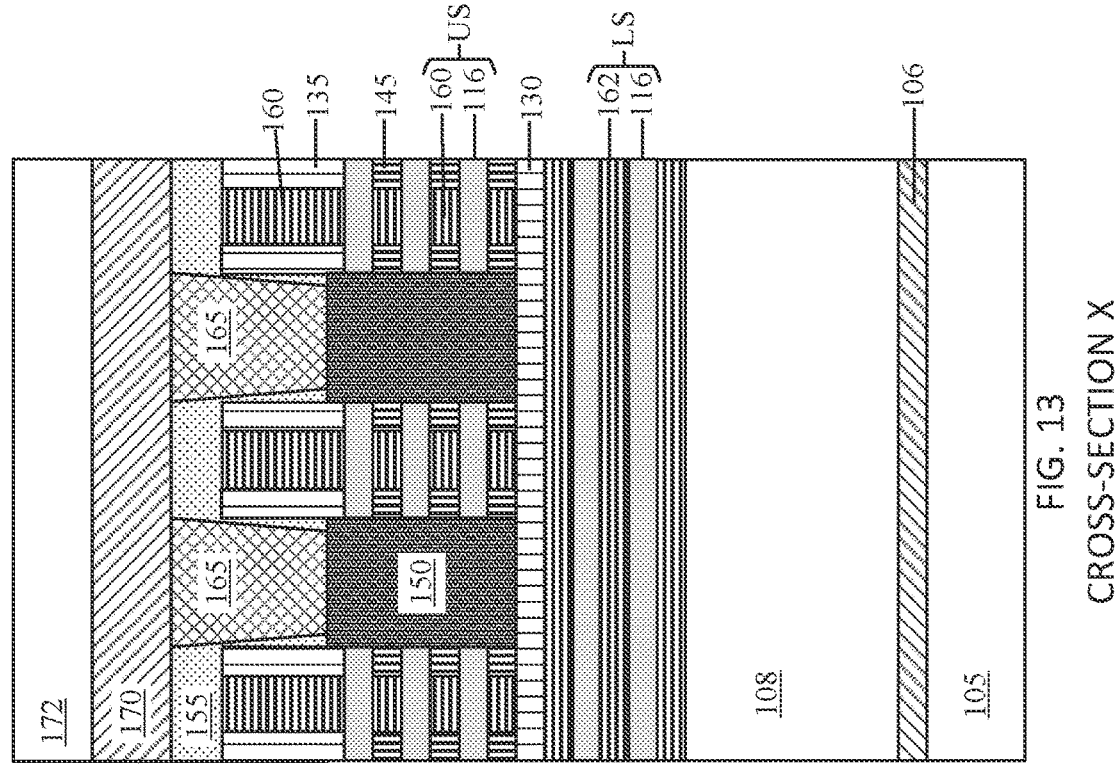
FIG. 13 illustrates a cross section X of the stack of alternating layers of the stacked FET device after the formation additional frontside interlayer dielectric layer, trench epi, frontside contacts, back-end-of-the-line (BEOL) layer, and the carrier wafer, in accordance with the embodiment of the present invention.
Figure 13:
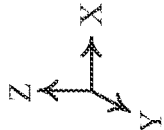
Figure 14:
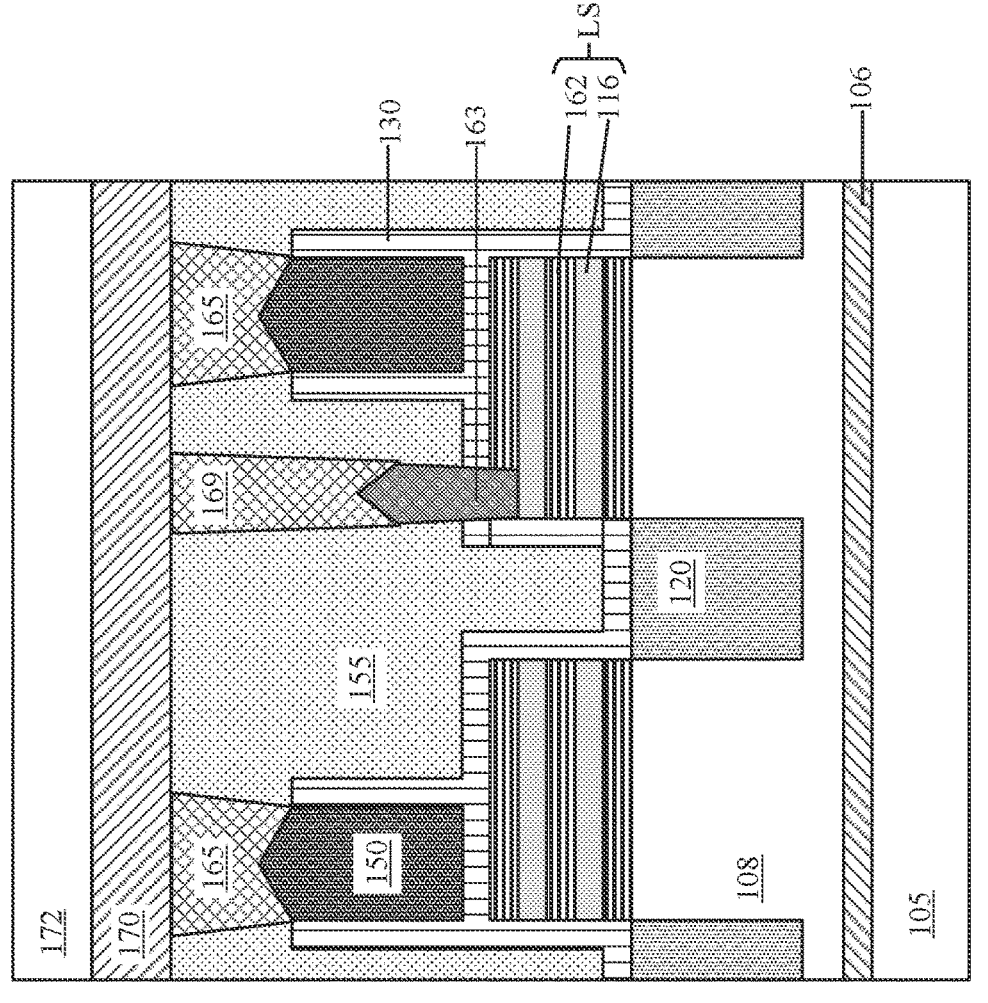
FIG. 14 illustrates a cross section Y of the source/drain region of the stacked FET device after the formation additional frontside interlayer dielectric layer, trench epi, frontside contacts, back-end-of-the-line (BEOL) layer, and the carrier wafer, in accordance with the embodiment of the present invention.

FIGS. 13 and 14 illustrate the processing stage of the structure after the formation of additional frontside interlayer dielectric layer 155, trench epi 163, frontside contacts 165, 169, back-end-of-the-line (BEOL) layer 170, and the carrier wafer 172. Additional frontside interlayer dielectric layer material is deposited to extend the frontside interlayer dielectric layer 155 over the top of the upper gate 160. A plurality of trenches (not shown) is formed in the frontside interlayer dielectric layer 155. A trench can be located on top of each of the upper source/drains 150. Another trench can extend downwards through the spacer 130 into the alternating layers of the lower stack LS. A trench epi 163 is formed in the trench that extends into the lower stack LS. The trenches are filled with a conductive material to form frontside contacts 165, 169. The frontside contacts 165 are in contact with a frontside surface of the upper source/drains 150. Frontside contact 169 is in contact with a frontside surface of the trench epi 163, such that frontside contact 169 will eventually be the frontside contact for a lower source/drain. Back-end-of-the-line (BEOL) layers 170 are formed on top of the frontside interlayer dielectric layer 155 and on top of the frontside contacts 165, 169. Carrier wafer 172 is formed on top of the BEOL layer 170.

Figure 15:
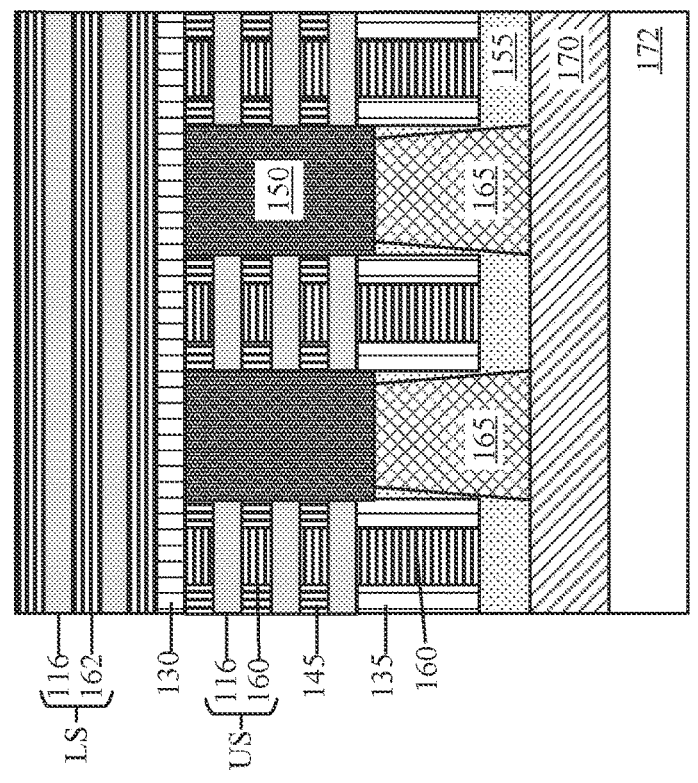
FIG. 15 illustrates a cross section X of the stack of alternating layers of the stacked FET device after flipping the stack FET over for backside processing and the removal of multiple layers, in accordance with the embodiment of the present invention.
Figure 15:
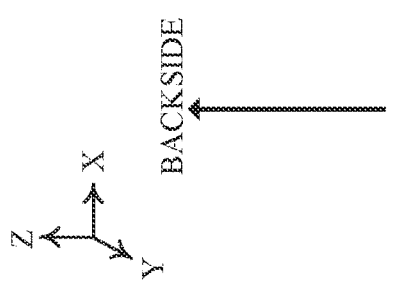
Figure 15:
Figure 16:
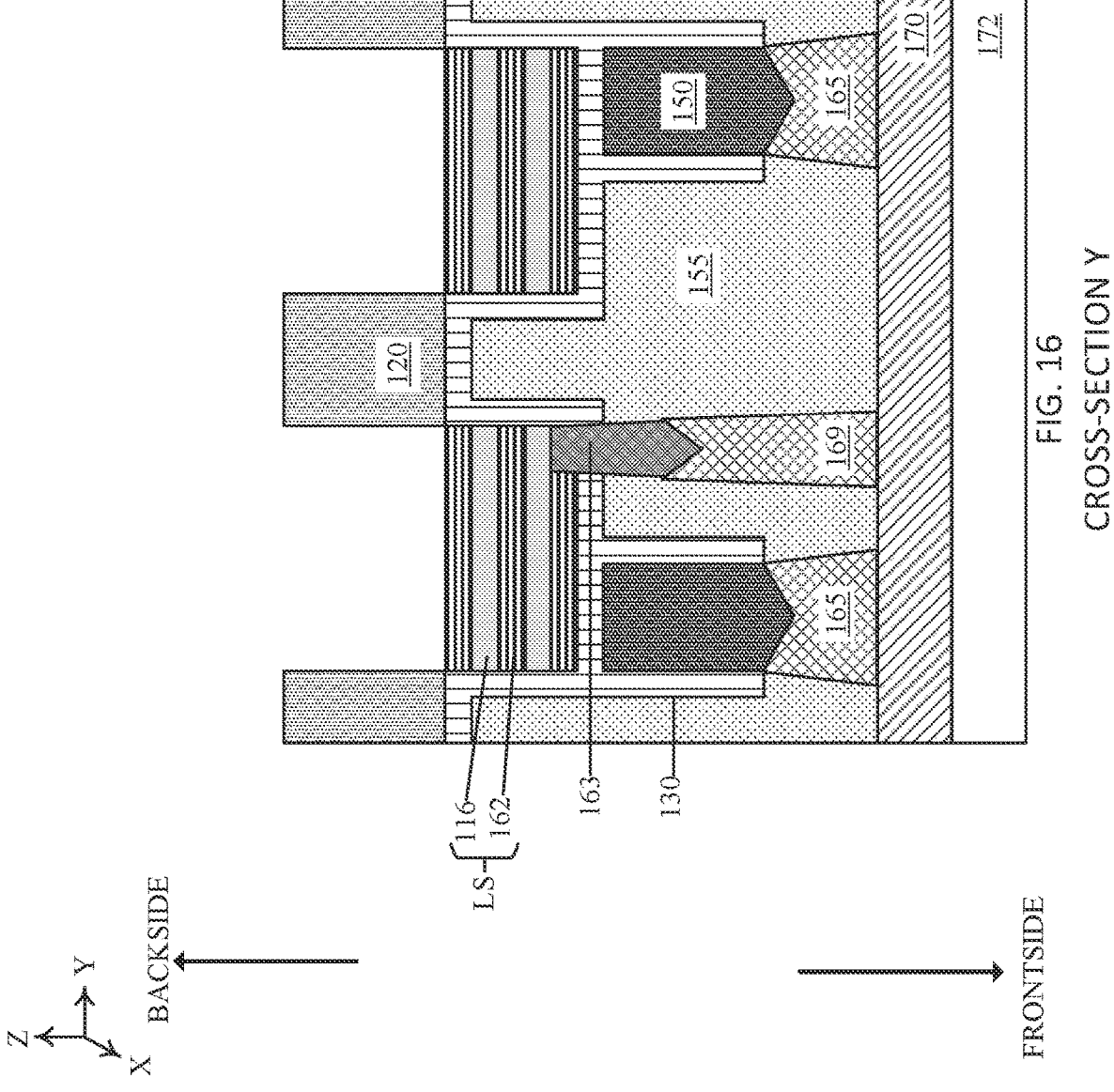
FIG. 16 illustrates a cross section Y of the source/drain region of the stacked FET device after flipping the stack FET over for backside processing and the removal of multiple layers, in accordance with the embodiment of the present invention.

FIGS. 15 and 16 illustrate the processing stage of the structure after flipping the stack FET over for backside processing and the removal of multiple layers. The stacked FET is flipped over for backside processing, where the first substrate 105 is removed. Then the etch stop 106 and the second substrate 108 is removed. The removal of these layers exposes a backside surface of one of the alternating lower gate 162 and the channel layers 116 of the lower stack LS. Furthermore, the removal of the second substrate 108 creates trenches between sections of the shallow trench isolation layer 120, as illustrated in FIG. 16.

Figure 17:
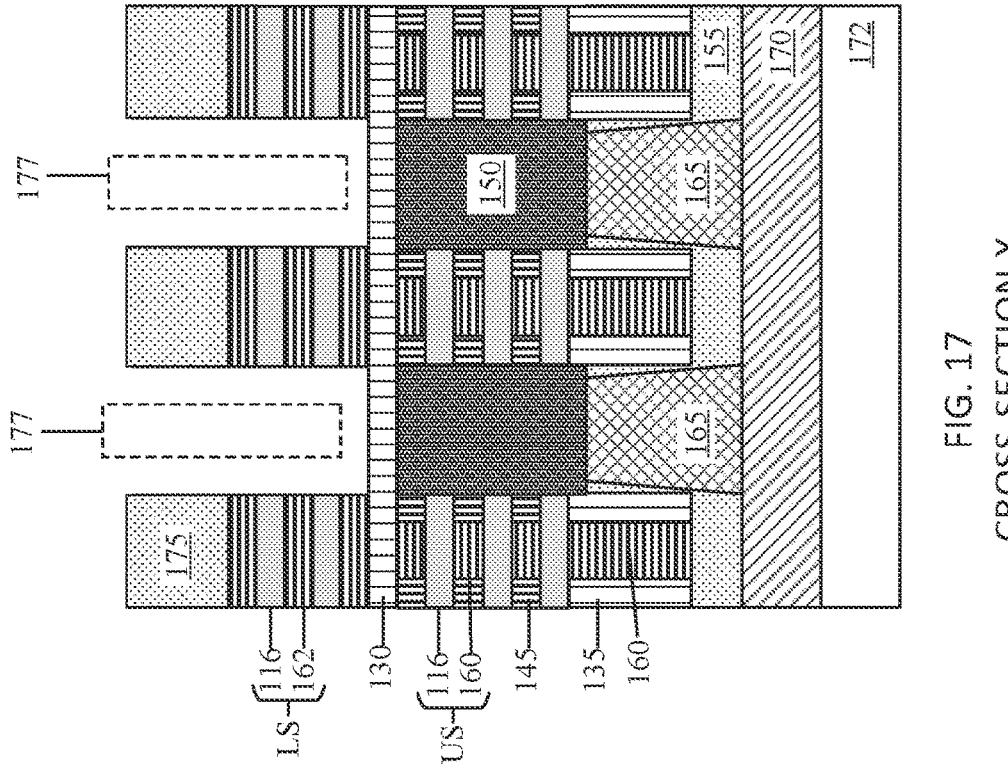
FIG. 17 illustrates a cross section X of the stack of alternating layers of the stacked FET device after formation of the lower source/drain regions, in accordance with the embodiment of the present invention.
Figure 17:
Figure 18:
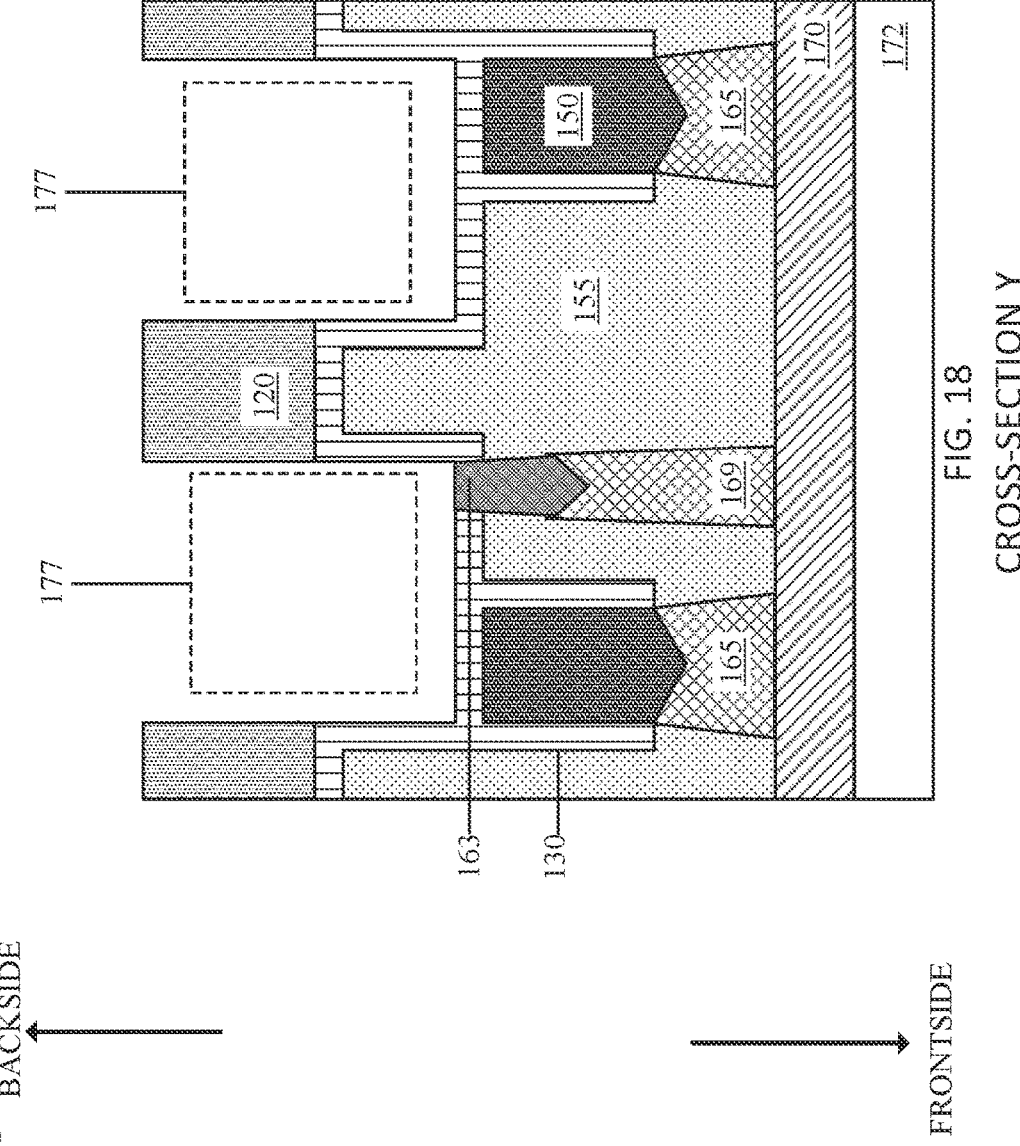
FIG. 18 illustrates a cross section Y of the source/drain region of the stacked FET device after formation of the lower source/drain regions, in accordance with the embodiment of the present invention.

FIGS. 17 and 18 illustrate the processing stage of the structure after formation of the lower source/drain regions 177. A backside interlayer dielectric layer 175 is formed on the backside surface of the alternating layers of the lower stack LS. The backside interlayer dielectric layer 175 and lower stack LS are patterned to form the lower source/drain regions 177. A portion of trench epi 163 that extended into the alternating layers of the lower stack LS is removed during the formation of the lower source/drain regions 177, as illustrated in FIG. 18. The formation of the lower source/drain regions 177 separates the alternating layers of the lower stack LS into a plurality of columns, as illustrated in FIG. 17.

Figure 19:
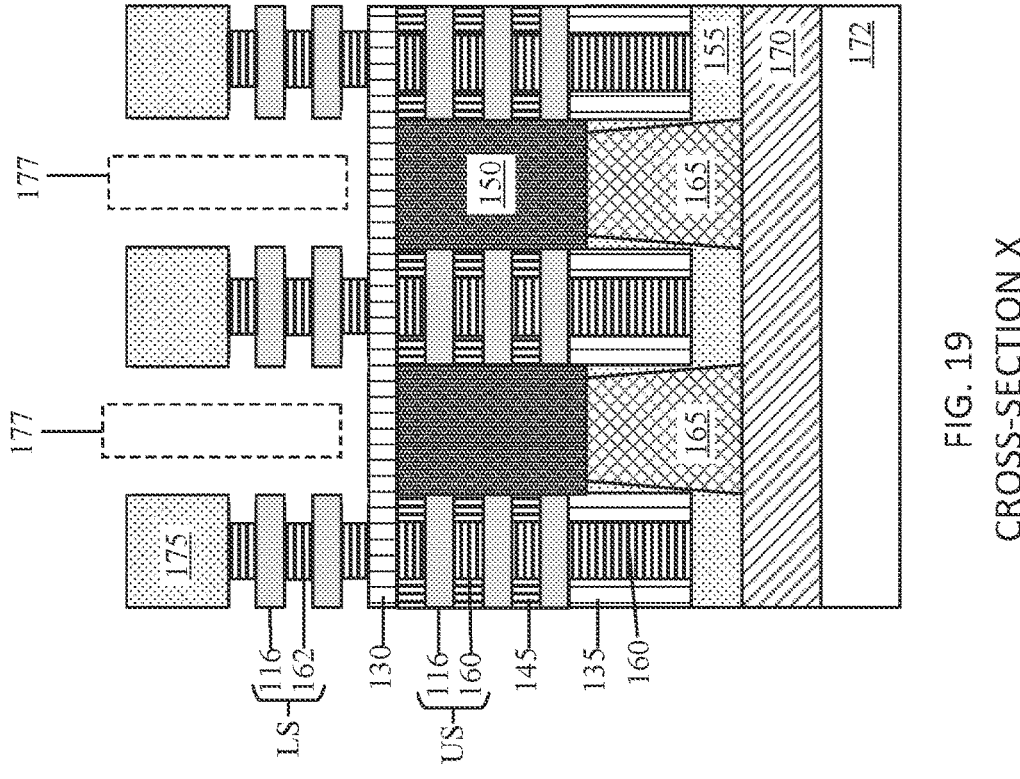
FIG. 19 illustrates a cross section X of the stack of alternating layers of the stacked FET device after recessing the lower gate, in accordance with the embodiment of the present invention.
Figure 19:

FIG. 19 illustrates the processing stage of the structure after recessing the lower gate 162. Each of the lower gate 162 layers in each of the columns of the lower stack LS are recessed. The recessing process separates the ends of the lower gate 162 and the ends of the channel layers 116 of the lower stack LS.

Figure 20:
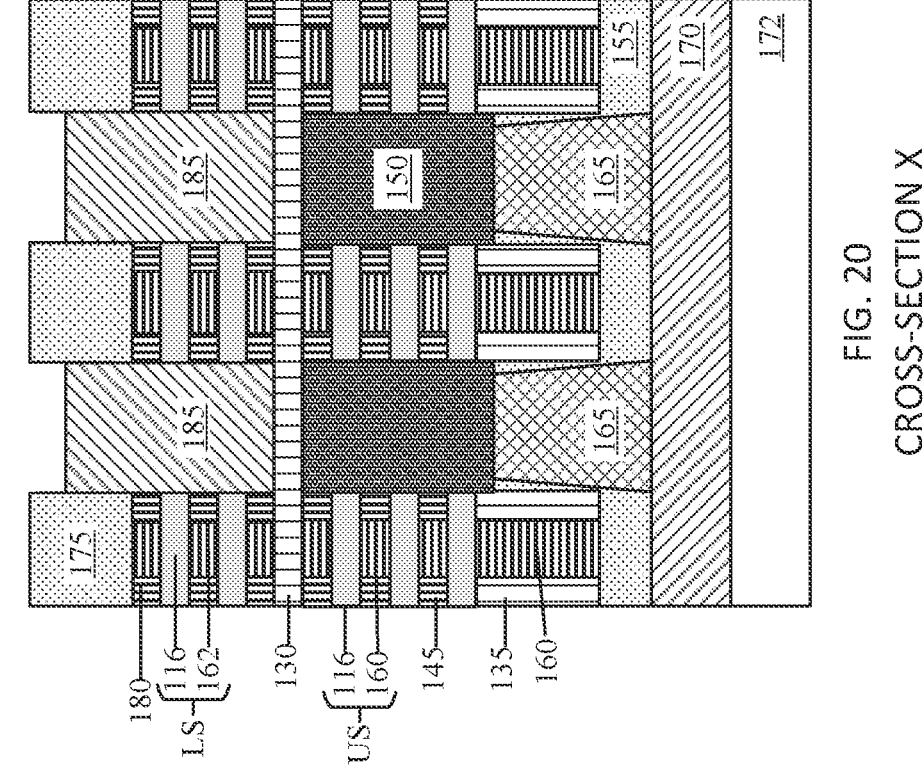
FIG. 20 illustrates a cross section X of the stack of alternating layers of the stacked FET device after formation of lower inner spacers and lower source/drains, in accordance with the embodiment of the present invention.
Figure 20:
Figure 21:
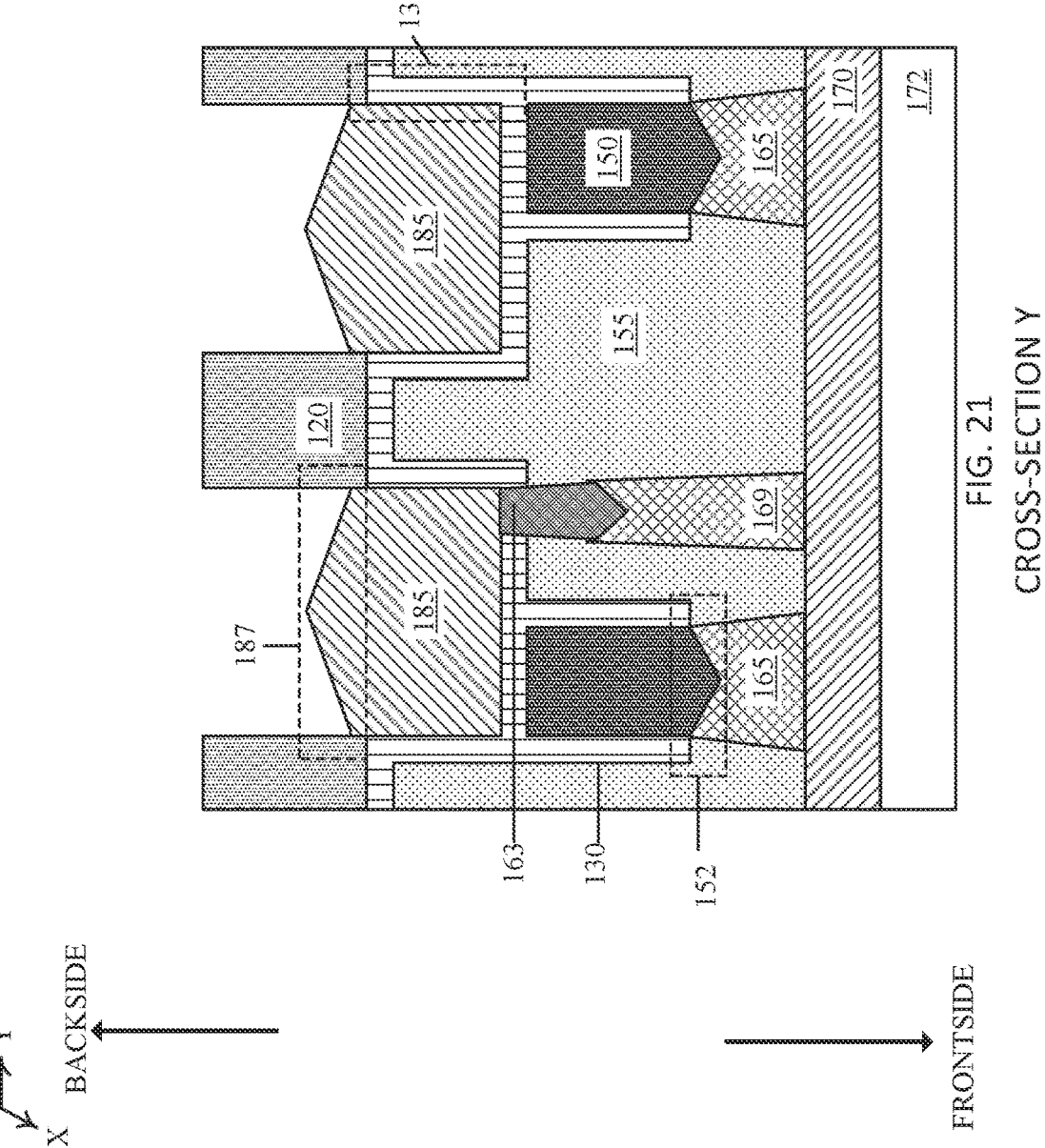
FIG. 21 illustrates a cross section Y of the source/drain region of the stacked FET device after formation of lower inner spacers and lower source/drains, in accordance with the embodiment of the present invention.

FIGS. 20 and 21 illustrate the processing stage of the structure after formation of lower inner spacers 180 and lower source/drains 185. Lower inner spacer 180 is formed in the space created by the recessing of the lower gate 162. The lower inner spacer 180 is in contact with lower gate 162 and the channel layers 116 of the lower stack LS. Lower source/drains 185 are epitaxially grown in the lower source/drain regions 177 located between the columns. Vertical sections of spacer 130, as emphasized by dashed box 131, act as retaining walls during the formation of the lower source/drain 185. The lower source/drains 185 have a protrusion/point/tip that points towards the backside of the device. Dashed box 187 emphasizes the direction of the protrusion/point/tip of the lower source/drain 185. The protrusion/point/tip of the upper source/drain 150, as emphasized by dashed box 152, is in the opposite direction (i.e., towards the frontside) then the direction of the protrusion/point/tip (i.e., towards the backside) of the lower source/drain 185, as emphasized by dashed box 187. The trench epi 163 is in contact with a bottom surface of one of the lower source/drains 185, such that the frontside contact 169 is connected to the lower source/drain 185 via the trench epi 163.

The lower source/drains 185 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 22:
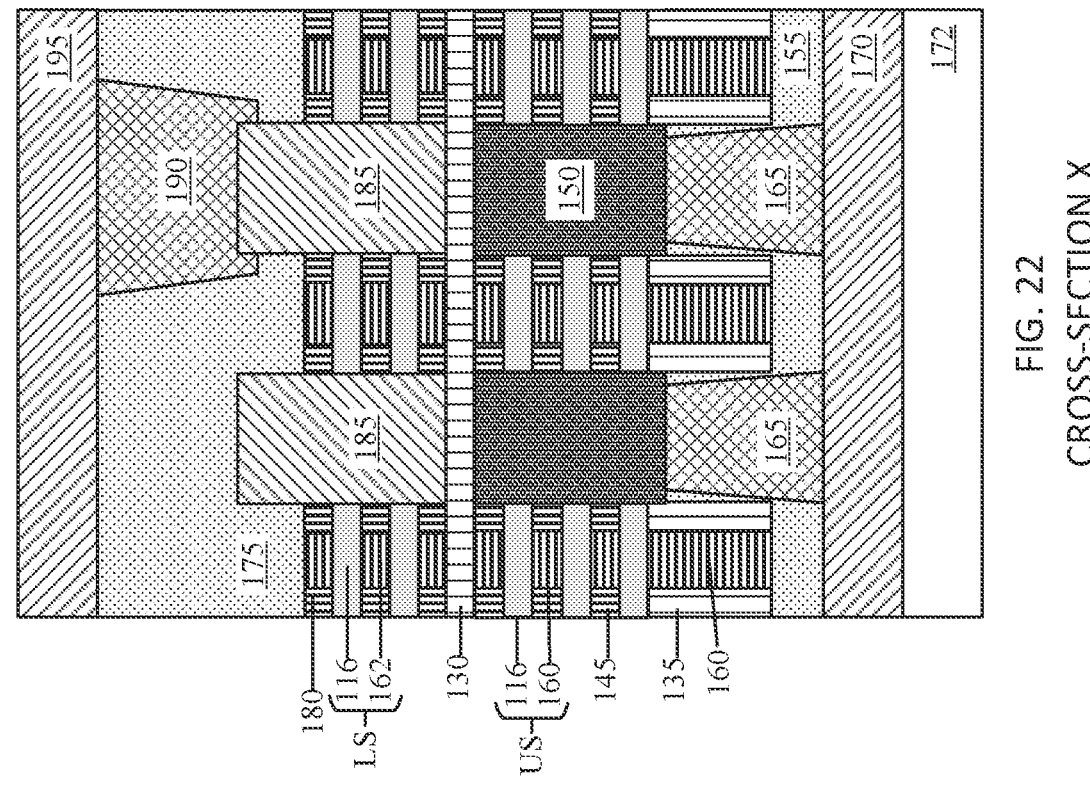
FIG. 22 illustrates a cross section X of the stack of alternating layers of the stacked FET device after additional backside interlayer dielectric material is added, formation of backside contact, and the formation of the backside-power-distribution-network (BSPDN), in accordance with the embodiment of the present invention.
Figure 22:
Figure 23:
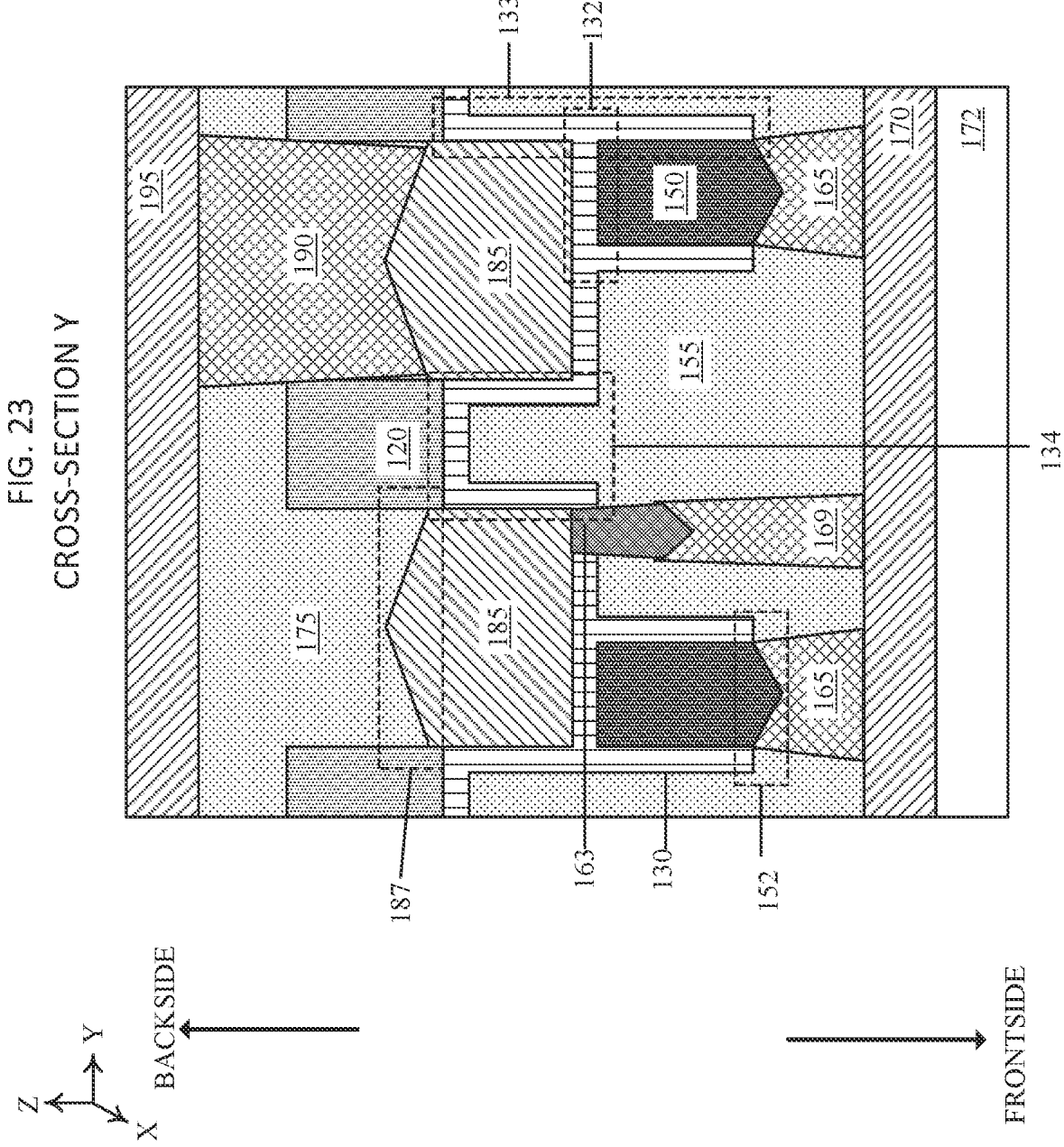
FIG. 23 illustrates a cross section Y of the source/drain region of the stacked FET device after additional backside interlayer dielectric material is added, formation of backside contact, and the formation of the backside-power-distribution-network (BSPDN), in accordance with the embodiment of the present invention.

FIGS. 22 and 23 illustrate the processing stage of the structure after additional backside interlayer dielectric material is added, formation of backside contact 190, and the formation of the backside-power-distribution-network (BSPDN) 195. Additional backside interlayer dielectric material is added to extend the backside interlayer dielectric layer 175 on top of the lower source/drains 185 and on top of the shallow trench isolation layer 120. Trenches (not shown) are formed in the backside interlayer dielectric layer 175, where the trench exposes a surface of a lower source/drain 185. The trenches are filled with a conductive metal to form the backside contacts 190. A backside-power-distribution-network (BSPDN) is formed on top of the backside interlayer dielectric layer 175 and on top of the backside contacts 190.

FIGS. 22 and 23 illustrate a stacked nanosheet FET transistor that includes an upper nanosheet transistor US and a lower nanosheet transistor LS. The upper nanosheet transistor US includes an upper source/drain 150 and the upper source/drain 150 includes an upper tip (as emphasized by dashed box 152) that is pointed in a first direction. The lower nanosheet transistor LS includes a lower source/drain 185 and the lower source/drain 185 includes a lower tip (as emphasized by dashed box 187) pointed in a second direction. The first direction (i.e., towards the frontside) is different than the second direction (i.e., towards the backside). Spacer 130 is located between the upper source/drain 150 and the lower source/drain 185. Opposite sides of spacer 130 (as emphasized by dashed box 132) are in direct contact with the upper source/drain 150 or the lower source/drain 185, respectively. Spacer 130 includes a plurality of vertical segments. One of the plurality of vertical segments of the spacer 130 is located along a vertical sidewall of one of the upper source/drain 150 or the lower source/drains 185. One of the plurality of vertical segments of the spacer 130 extends along a sidewall of the upper source/drain 150 and a sidewall of the lower source/drain 185 as emphasized by dashed box 133. A first frontside contact 165 is connected to the tip of the upper source/drain 150. A second frontside contact 169 connected to the lower source/drain 185, via the trench epi 163. A backside contact 190 connected to the tip of the lower source/drain 185.

FIGS. 22 and 23 illustrate a microelectronic structure that includes a stacked nanosheet FET transistor that includes an upper nanosheet transistor US and a lower nanosheet transistor LS. The upper nanosheet transistor US includes an upper source/drain 150 and the upper source/drain 150 includes an upper tip (as emphasized by dashed box 152) that is pointed in a first direction. The upper source/drain 150 has a first width as measured in parallel with a gate direction.

The lower nanosheet transistor LS includes a lower source/drain 185 and the lower source/drain 185 includes a lower tip (as emphasized by dashed box 187) pointed in a second direction. The lower source/drain 185 has a second width as measure in parallel with the gate direction. The first direction (i.e., towards the frontside) is different than the second direction (i.e., towards the backside) and the second width is larger than the first width. Spacer 130 is located between the upper source/drain 150 and the lower source/drain 185. Opposite sides of spacer 130 (as emphasized by dashed box 132) are in direct contact with the upper source/drain 150 or the lower source/drain 185, respectively. Spacer 130 includes a plurality of vertical segments. One of the plurality of vertical segments of the spacer 130 is located along a vertical sidewall of one of the upper source/drain 150 or the lower source/drains 185. One of the plurality of vertical segments of the spacer 130 extends along a sidewall of the upper source/drain 150 and a sidewall of the lower source/drain 185 as emphasized by dashed box 133. A first frontside contact 165 is connected to the tip of the upper source/drain 150. A second frontside contact 169 connected to the lower source/drain 185, via the trench epi 163. A backside contact 190 connected to the tip of the lower source/drain 185.

FIGS. 22 and 23 illustrate a microelectronic structure that includes a first stacked nanosheet FET transistor that includes a first upper nanosheet transistor US and a first lower nanosheet transistor LS. The first upper nanosheet transistor US includes a first upper source/drain 150 and the first upper source/drain 150 includes a first upper tip (as emphasized by dashed box 152) that is pointed in a first direction. The first upper source/drain 150 has a first width as measured in parallel with a gate direction. The first lower nanosheet transistor LS includes a first lower source/drain 185 and the first lower source/drain 185 includes a first lower tip (as emphasized by dashed box 187) pointed in a second direction. The first lower source/drain 185 has a second width as measure in parallel with the gate direction. The second width is larger than the first width.

A second stacked nanosheet FET transistor that includes a second upper nanosheet transistor US and a second lower nanosheet transistor LS. The second upper nanosheet transistor US includes a second upper source/drain 150 and the second upper source/drain 150 includes a first upper tip (as emphasized by dashed box 152) that is pointed in a first direction. The second upper source/drain 150 has a third width as measured in parallel with the gate direction. The second lower nanosheet transistor LS includes a second lower source/drain 185 and the second lower source/drain 185 includes a second lower tip (as emphasized by dashed box 187) pointed in the second direction. The second lower source/drain 185 has a fourth width as measure in parallel with the gate direction. The first direction (i.e., towards the frontside) is different than the second direction (i.e., towards the backside) and the fourth width is larger than the third width.

A spacer 130 is located between the first upper source/drain 150 and the first lower source/drain 185 and the spacer 130 is located between the second upper source/drain 150 and the second lower source/drain 185, and wherein the spacer 130 is continuous between the first lower source/drain 185 and the second lower source/drain 185, as emphasized by dashed box 134.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
   a stacked nanosheet FET transistor that includes an upper nanosheet transistor and a lower nanosheet transistor, wherein the upper nanosheet transistor includes an upper source/drain, wherein the upper source/drain includes a upper tip that is pointed in a first direction, wherein the lower nanosheet transistor includes a lower source/drain, wherein the lower source/drain includes a lower tip pointed in a second direction, and wherein the first direction is different than the second direction; and
   a spacer that is in direct contact with multiple surfaces of the upper source/drain and in direct contact with multiple surfaces of the lower source/drain.

2. The microelectronic structure of claim 1, wherein the spacer is located between the upper source/drain and the lower source/drain.

3. The microelectronic structure of claim 2, wherein opposite sides of spacer are in direct contact with the upper source/drain or the lower source/drain, respectively.

4. The microelectronic structure of claim 2, wherein the spacer further comprises a plurality of vertical segments.

5. The microelectronic structure of claim 4, wherein one of the plurality of vertical segments of the spacer is located along vertical sidewall of one of the upper source/drain or the lower source/drains.

6. The microelectronic structure of claim 4, wherein one of the plurality of vertical segments of the spacer extends along a sidewall of the upper source/drain and a sidewall of the lower source/drain.

7. The microelectronic structure of claim 1, further comprising:
   a first frontside contact connected to the tip of the upper source/drain.

8. The microelectronic structure of claim 7, further comprising:
   a second frontside contact connected to the lower source/drain.

9. The microelectronic structure of claim 7, further comprising:
   a backside contact connected to the tip of the lower source/drain.

10. A microelectronic structure comprising:
    a stacked nanosheet FET transistor that includes an upper nanosheet transistor and a lower nanosheet transistor, wherein the upper nanosheet transistor includes an upper source/drain, wherein the upper source/drain includes a upper tip that is pointed in a first direction, wherein the upper source/drain has a first width as measured in parallel with a gate direction, wherein the lower nanosheet transistor includes a lower source/drain, wherein the lower source/drain includes a lower tip pointed in a second direction, wherein the lower source/drain has a second width as measure in parallel with the gate direction, wherein the first direction is different than the second direction, and wherein the second width is larger than the first width; and a spacer that is in direct contact with multiple surfaces of the upper source/drain and in direct contact with multiple surfaces of the lower source/drain.

11. The microelectronic structure of claim 10, wherein the spacer is located between the upper source/drain and the lower source/drain.

12. The microelectronic structure of claim 11, wherein opposite sides of spacer are in direct contact with the upper source/drain or the lower source/drain, respectively.

13. The microelectronic structure of claim 11, wherein the spacer further comprises a plurality of vertical segments.

14. The microelectronic structure of claim 13, wherein one of the plurality of vertical segments of the spacer is located along vertical sidewall of one of the upper source/drain or the lower source/drains.

15. The microelectronic structure of claim 13, wherein one of the plurality of vertical segments of the spacer extends along a sidewall of the upper source/drain and a sidewall of the lower source/drain.

16. The microelectronic structure of claim 10, further comprising:

a first frontside contact connected to the tip of the upper source/drain.

17. The microelectronic structure of claim 16, further comprising:

a second frontside contact connected to the lower source/drain.

18. The microelectronic structure of claim 16, further comprising:

a backside contact connected to the tip of the lower source/drain.

19. A microelectronic structure comprising:

a first stacked nanosheet FET transistor that includes a first upper nanosheet transistor and a first lower nanosheet transistor, wherein the first upper nanosheet transistor includes a first upper source/drain, wherein the first upper source/drain includes a first upper tip that is pointed in a first direction, wherein the first upper source/drain has a first width as measured in parallel with a gate direction, wherein the lower nanosheet transistor includes a first lower source/drain, wherein the first lower source/drain includes a first lower tip pointed in a second direction, wherein the first lower source/drain has a second width as measure in parallel with the gate direction, and wherein the second width is larger than the first width; and a second stacked nanosheet FET transistor that includes a second upper nanosheet transistor and a second lower nanosheet transistor, wherein the second upper nanosheet transistor includes a second upper source/drain, wherein the second upper source/drain includes a second upper tip that is pointed in the first direction, wherein the second upper source/drain has a third width as measured in parallel with the gate direction, wherein the second lower nanosheet transistor includes a second lower source/drain, wherein the second lower source/drain includes a second lower tip pointed in the second direction, wherein the second lower source/drain has a fourth width as measure in parallel with the gate direction, wherein the first direction is different than the second direction, and wherein the fourth width is larger than the third width.

20. The microelectronic structure of claim 19, further comprising:

a spacer located between the first upper source/drain and the first lower source/drain and the spacer is located between the second upper source/drain and the second lower source/drain, and wherein the spacer is continuous between the first lower source/drain and the second lower source/drain.

* * * * *